(12) United States Patent
Gutberlet et al.

(10) Patent No.: US 7,919,231 B2
(45) Date of Patent: Apr. 5, 2011

(54) PHOTOLITHOGRAPHIC METHOD AND MASK DEVICES UTILIZED FOR MULTIPLE EXPOSURES IN THE FIELD OF A FEATURE

(75) Inventors: Mary Kathryn Gutberlet, Prunedale, CA (US); Rambod Nader, Campbell, CA (US); Michael Andrew Parker, Fremont, CA (US); Douglas Johnson Werner, Fremont, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 620 days.

(21) Appl. No.: 11/899,383

(22) Filed: Sep. 4, 2007

(65) Prior Publication Data
US 2009/0081562 A1     Mar. 26, 2009

(51) Int. Cl.
*G03C 5/00* (2006.01)
*G03F 1/00* (2006.01)
*G03F 7/00* (2006.01)

(52) U.S. Cl. ............................ 430/394; 430/5; 430/311
(58) Field of Classification Search ................ 430/5, 22, 430/311–313, 394; 382/144
See application file for complete search history.

(56) References Cited

U.S. PATENT DOCUMENTS

| | | | |
|---|---|---|---|
| 4,902,899 A | 2/1990 | Lin et al. | |
| 5,286,584 A | 2/1994 | Gemmink et al. | |
| 5,407,785 A | 4/1995 | Leroux | |
| 5,486,449 A | 1/1996 | Hosono et al. | |
| 5,721,651 A | 2/1998 | Kitahara | |
| 5,753,417 A | 5/1998 | Ulrich | |
| 5,958,656 A | 9/1999 | Nakao | |
| 5,972,569 A | 10/1999 | Jeng et al. | |
| 6,337,162 B1 * | 1/2002 | Irie | 430/5 |
| 6,528,238 B1 | 3/2003 | Adams et al. | |
| 6,558,881 B2 | 5/2003 | Tokushima | |
| 6,670,080 B2 | 12/2003 | Sugita et al. | |
| 6,686,099 B2 * | 2/2004 | Tanaka et al. | 430/5 |
| 6,731,373 B2 | 5/2004 | Shoji | |
| 6,816,233 B2 | 11/2004 | Sugita | |

(Continued)

FOREIGN PATENT DOCUMENTS

JP     61059830     3/1986

(Continued)

OTHER PUBLICATIONS

LARS-CHR. Wittig, et al.; "Alternative Method of Gray Tone Lithography with Potential for the Fabrication of Combined Continuous 3-Dimensional . . . ", Proc. of SPIE vol. 5183 2003.

(Continued)

*Primary Examiner* — Stephen Rosasco
*Assistant Examiner* — Stewart A Fraser
(74) *Attorney, Agent, or Firm* — Zilka-Kotab, PC

(57) ABSTRACT

A photolithographic method for forming a plurality of characters on a device utilizes a mask set that includes a plurality of photolithographic masks, wherein each mask includes at least one non-opaque mask character field area that surrounds a non-opaque mask character area. Photoresist is exposed to radiation energy density through the set of masks using the masks sequentially to create at least one character field area of the photoresist, and a character area of the photoresist. Ultimately, because the character areas of the photoresist are exposed to some light energy density from the non-opaque mask character field areas during each mask exposure step, the total photoresist exposure time to create the series of characters is less than that of the prior art.

29 Claims, 7 Drawing Sheets

U.S. PATENT DOCUMENTS

| | | | |
|---|---|---|---|
| 6,824,958 B2 * | 11/2004 | Hayano et al. | 430/311 |
| 6,884,551 B2 | 4/2005 | Fritze et al. | |
| 6,897,010 B2 | 5/2005 | Hirooka | |
| 6,924,090 B2 | 8/2005 | Hirooka | |
| 7,026,106 B2 | 4/2006 | Chang | |
| 7,070,907 B2 * | 7/2006 | Fujimoto et al. | 430/311 |
| 7,759,026 B2 * | 7/2010 | Fujimura et al. | 430/5 |
| 2003/0036025 A1 * | 2/2003 | Hirooka | 430/394 |
| 2003/0190536 A1 * | 10/2003 | Fries | 430/22 |
| 2003/0235950 A1 | 12/2003 | Chung | |
| 2008/0292974 A1 * | 11/2008 | Huang et al. | 430/5 |

FOREIGN PATENT DOCUMENTS

| | | |
|---|---|---|
| JP | 62020116 | 1/1987 |
| JP | 5121291 | 5/1993 |
| JP | 6083032 | 3/1994 |
| JP | 10335605 | 12/1998 |
| JP | 200019711 | 1/2000 |
| JP | 2000260701 | 9/2000 |
| JP | 2001110719 | 4/2001 |
| JP | 2002107942 | 4/2002 |
| JP | 2004134447 | 4/2004 |
| JP | 2006010797 | 1/2006 |

OTHER PUBLICATIONS

C. Genet & T.W. Ebbesen; "Light in tiny holes"; vol. 445/Jan. 4, 2007/doi:10.1038/nature05350.

Chinese Office Action Summary from application No. 200810213774.7 dated Dec. 9, 2010 (no translation).

* cited by examiner

PHOTOLITHOGRAPHIC METHOD AND MASK DEVICES UTILIZED FOR MULTIPLE EXPOSURES IN THE FIELD OF A FEATURE

BACKGROUND OF THE INVENTION

1. Field of the Invention

The present invention relates generally to photolithographic methods and mask devices that are utilized for multiple exposures of photoresist in the field of a feature, such as the placement of an identification number on a device such as a slider for a magnetic head.

2. Description of the Prior Art

When devices are created on a wafer substrate, such as a slider including a magnetic head or other microelectronic devices, an identification number is typically created on each such device. In the past, the identification number has been written on the back side of the slider using a laser etching technique. However, flash (ablated particulates) on the back side of the wafer due to the laser serialization of the sliders can result in the redeposition on the front side of the ablated material from the site of the characters formed on the back of the slider. This etching created flash can be deleterious to hard disk drive performance because it is a source of contamination that can lead to device failures, such as HDI's (head disk interactions), e.g. head crashes.

Moreover, as the dimensions of sliders move to the "femto" format, back side serialization of the slider necessitates the flipping of sliders over for inspection of slider identifiers in the serialization pattern. Since the small size of these sliders raises problems with regard to handling, it is desirable to serialize the front side of the wafer to avoid the handling that accompanies flipping these small format sliders over for inspection of slider identifiers.

More recent prior art slider serialization methods are based on photolithographic techniques that use mask sets to print row and column identifiers of sliders, as well as wafer identification numbers on individual sliders. However, these other methods, such as are described in U.S. Pat. Nos. 6,897,010 and 6,924,090, require significant processing time and are therefore costly. The methods and mask sets described in this invention provide a novel approach to front side serialization that brings substantial cost savings. Moreover, the invention may have many fundamental and novel applications outside of the particular embodiments recited with regard to wafer serialization when the invention is applied to the art of photolithography more generally.

SUMMARY OF THE INVENTION

The present invention includes a photolithographic mask set for creating a plurality of characters on a device, such as a series of identification characters formed on a magnetic head. The mask set includes a plurality of photolithographic masks, wherein each mask includes at least one mask character area and at least one mask character field area that surrounds each mask character area. Each mask character field area of each mask has a radiation energy density transmission factor $T_f$ that is greater than zero, and each mask character area has a radiation energy density transmission factor $T_c$ that is greater than zero, such that each mask character field area and each mask character area of each mask are not opaque.

A photolithographic method for forming a plurality of characters on a device utilizes the mask set. Initially a photoresist layer is fabricated upon the device in a location for forming the characters. The photoresist has a radiation energy density value $E_t$ wherein radiation energy density exposure below $E_t$ will not affect the photoresist during development, and a radiation energy density value $E_o$ wherein radiation energy density exposure above $E_o$ will affect the photoresist during development. The photoresist is exposed to radiation energy density through the set of masks using the masks sequentially such that the photoresist is exposed to radiation energy density through a mask character field area during each mask exposure, and the photoresist is also exposed to radiation through a mask character area during each mask exposure.

The exposure of the photoresist through a mask creates at least one character field area of the photoresist, and each character field area of the photoresist includes at least one character area of the photoresist in which a separate identification character is formed. Each character field area of the photoresist is exposed to radiation energy density through the mask set such that the total radiation energy density exposure in the character field area of the photoresist is less than $E_t$. Significantly, each character area of the photoresist is exposed to greater radiation energy density than the character field areas of the photoresist, such that the total character area radiation energy density exposure in the character area of the photoresist is greater than $E_o$. Ultimately, because the character areas of the photoresist are exposed to some light energy density from the mask character field areas during each mask exposure, the total photoresist exposure time to create the series of characters is less than that of the prior art.

It is an advantage of the photolithographic method of the present invention that the photoresist exposure time required to create a series of characters upon a device is reduced.

It is another advantage of the photolithographic method of the present invention that the exposure time for each mask that is used to create a character in a string of characters is reduced.

It is a further advantage of the photolithographic method of the present invention that a mask set is utilized which is not opaque in mask character field areas of the masks.

It is an advantage of the mask set of the present invention that it includes non-opaque mask character field areas and non-opaque mask character areas, such that a reduction in time of usage of the mask set to create a string of characters is achieved.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

The present invention is a photolithographic process that is employed where a series of masks are sequentially utilized to expose a particular photoresist area, such as an area used in the creation of a series of characters that may comprise a device identification number. By way of example, the application of an identification number in a photoresist field, where the number involves N characters will typically utilize N masks, where a portion of each mask includes a particular character, and the masks are utilized sequentially to create a character string that comprises the identification number; thus N exposures utilizing the N masks are conducted to create the character string.

Figure 1:
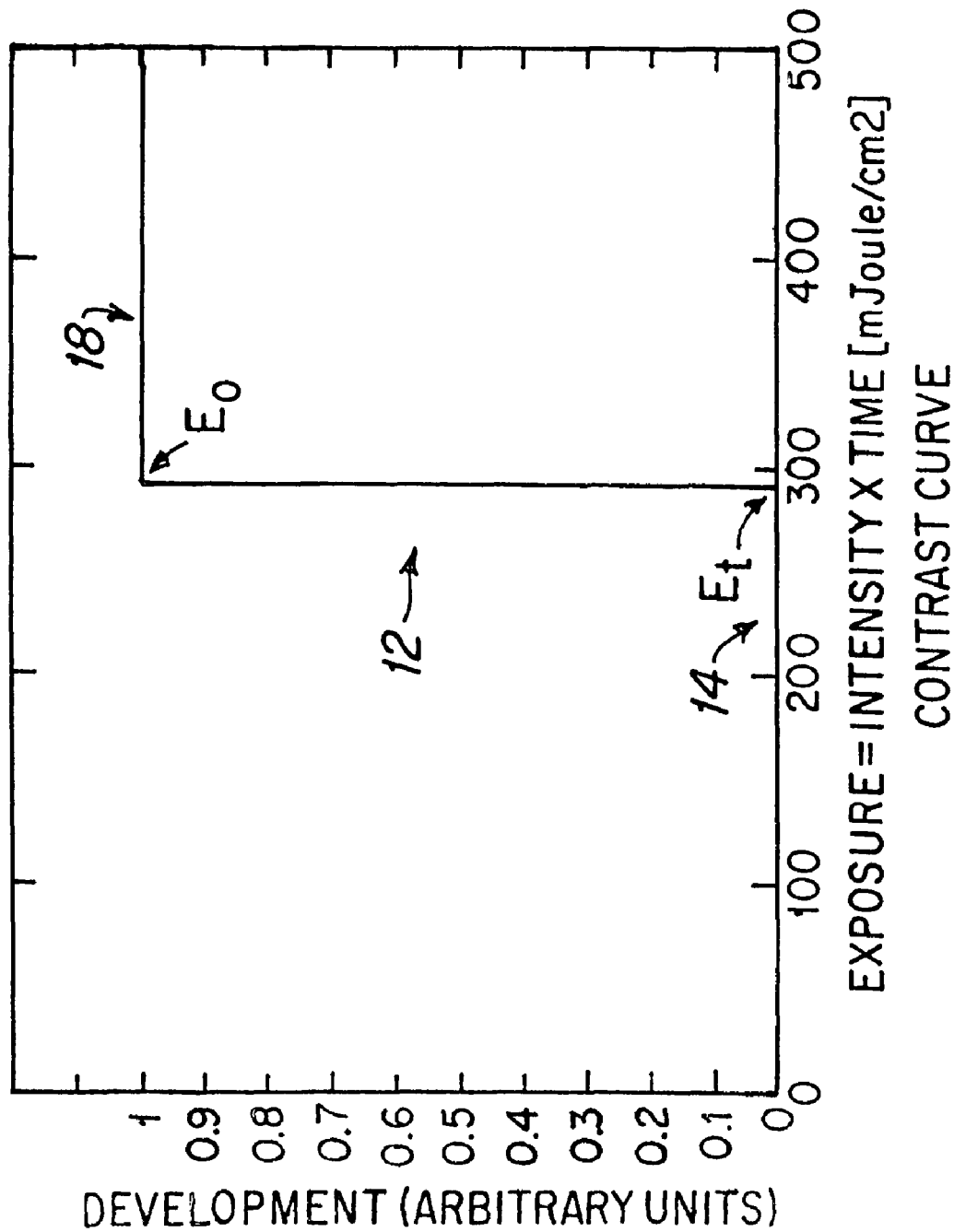
FIG. 1 is an exemplary contrast exposure curve of a photoresist that is suitable for use in the present invention.

FIG. 1 depicts a typical high contrast exposure curve 12 of a typical photoresist that is suitable for use in the photolithographic method of the present invention. This contrast curve is typical of many commonly used photolithographic resists, and a resist such as 4600 series resist from Clariant Company, Charlotte, N.C., is represented by such a contrast curve and is suitable for use in the present invention. With reference to FIG. 1, it is to be understood that where the photoresist is exposed to radiation energy density (such as light energy density) that is less than $E_t$ at the base of the curve 14, the development rate of the photoresist is essentially zero; that is, the photoresist is not affected by the radiation energy density during its development. Thereafter, when the radiation energy density exposure of the photoresist becomes greater than $E_o$ at the top of the curve 18, the photoresist is affected by the radiation energy density during development, such that the photoresist rapidly becomes fully developed. In the following description the radiation energy density that affects the photoresist may be referred to as light energy density, although the invention is not to be limited to the visible light wavelength range. Using this basic contrast curve, the photolithographic process of the prior art will next be briefly described, such that the features and improvements of the present invention can be better understood.

Figure 2:
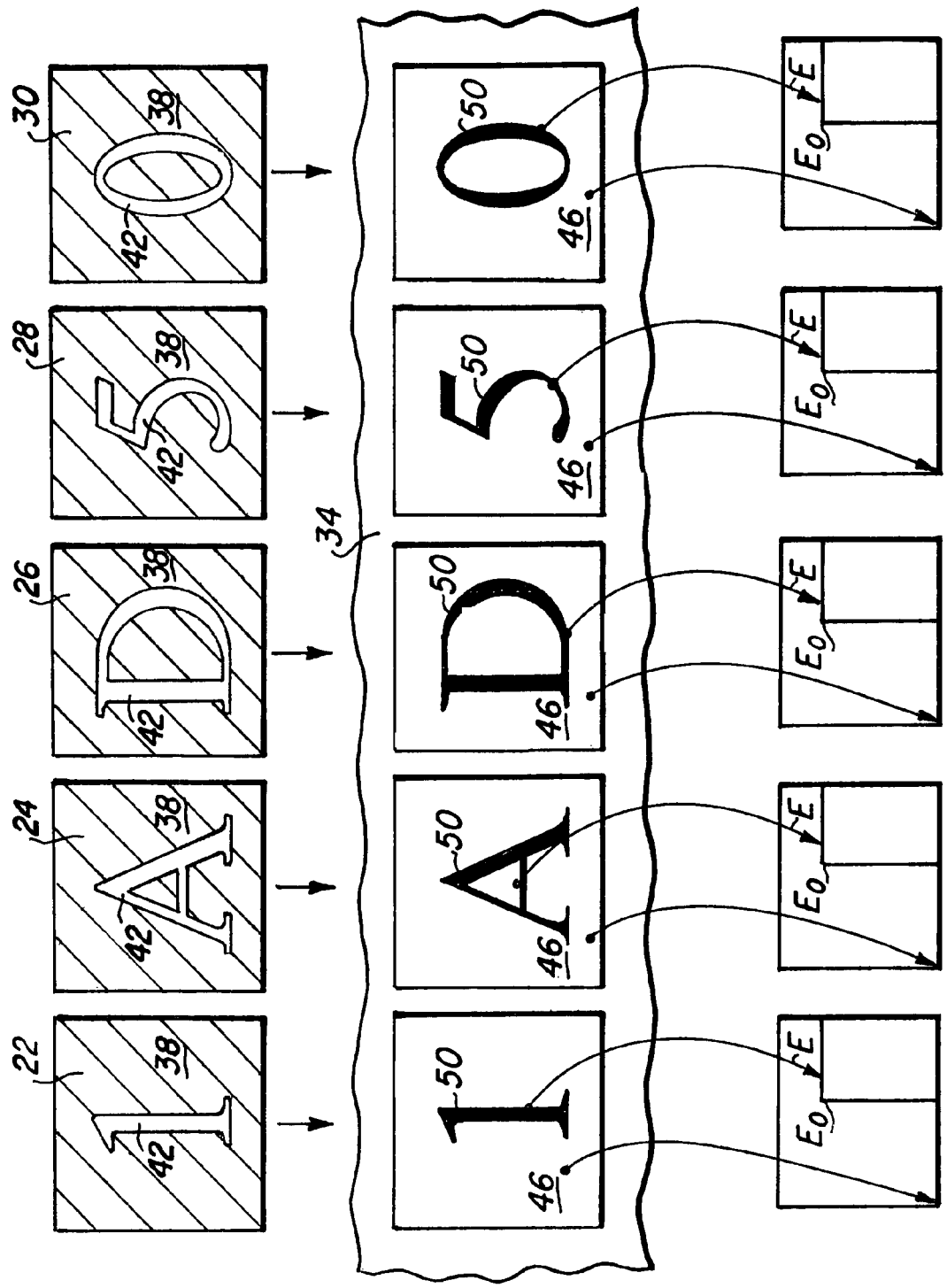
FIG. 2 is a diagrammatic representation of a prior art photolithographic method for fabricating a series of characters upon a device.

By way of a prior art example, FIG. 2 is a depiction of a prior art method for sequentially using a series of masks 22, 24, 26, 28 and 30 to expose a photoresist area 34 for creating the identification number 1AD50 in the photoresist area for subsequent photolithographic processing. Such a prior art method is described in U.S. Pat. Nos. 6,897,010 and 6,924,090. In creating the five characters 1AD50, the five masks 22-30 are sequentially utilized, where each mask includes a field area 38 which is opaque, such that no light passes therethrough, and a character area 42 which is transparent, such that the full light intensity passes therethrough. Therefore, it takes a particular exposure time $t_p$, at a particular light intensity I, to reach the necessary photoresist feature exposure energy density level $E=I\times t_p$ (where E is greater than $E_o$) for each character. Where N characters are to be applied, the total exposure time is $Nt_p$, where $t_p$ is the prior art exposure time of each mask. When this prior art process has been completed, the field exposure energy density of the photoresist 46 surrounding the characters 50 is zero because the masks are opaque in the field areas 38 of the masks 22-30, and the exposure energy density E of each character 50 is sufficient to develop the photoresist. For example, where a two minute exposure time $t_p$ is required to reach the feature exposure energy density level E, for the five character chain the total exposure time is ten minutes. As will next be described, the present invention may be utilized to significantly reduce the total exposure time that is required to create the characters. The present invention and the characteristics of the masks that are used are next described with the aid of FIGS. 3-7.

Figure 3:
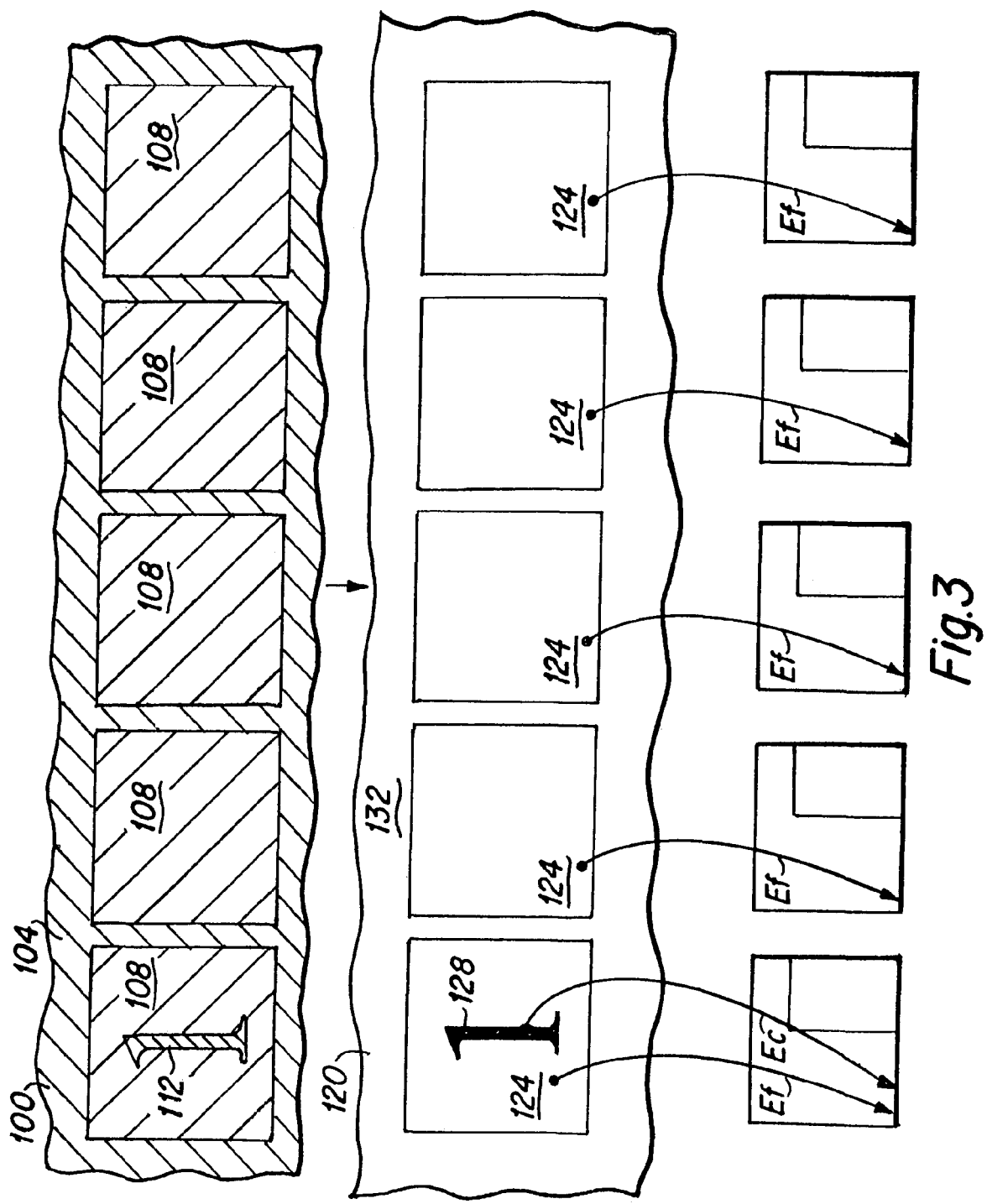
FIG. 3 is a diagrammatic depiction of a first photolithographic mask that is utilized in the photolithographic method for fabricating a series of characters of the present invention.

FIG. 3 depicts a first mask 100 of the present invention. The mask is formed with a background field area 104, character field areas 108 and a character (1) area 112. The character field areas 108 are not opaque; rather, the character field areas are designed to transmit some light energy density therethrough, and the character field areas 108 will have a light transmission factor $T_f$. Additionally, the character area 112 of the mask will have a light transmission factor $T_c$ that is greater than $T_f$ of the character field areas 108. The background area 104 may be opaque or it may have a light energy density transmission factor that is less than or equal to the light energy density transmission factor $T_f$ of the character field areas 108. Light passing through the character field areas 108 of the mask will have an intensity $I_f$ and light passing through the character area 112 of the mask will have an intensity $I_c$. Therefore, assuming a light intensity I, when the photoresist 120 is exposed using the first mask 100 for a time t, the character field areas 124 of the photoresist 120 receive a light exposure energy density of $E_f$, where $E_f=I_f\times t$, and the photoresist region 128 where the first character (1) is to be located receives an increased exposure energy density $E_c$, where $E_c=I_c\times t$. The background field area 132 of the photoresist 120 may receive zero light energy density if the background field area 104 of the mask 100 is opaque, or it may receive light energy density such as $E_f$ if the background field area 104 of the mask has a transmission factor such as $T_f$.

Figure 4:
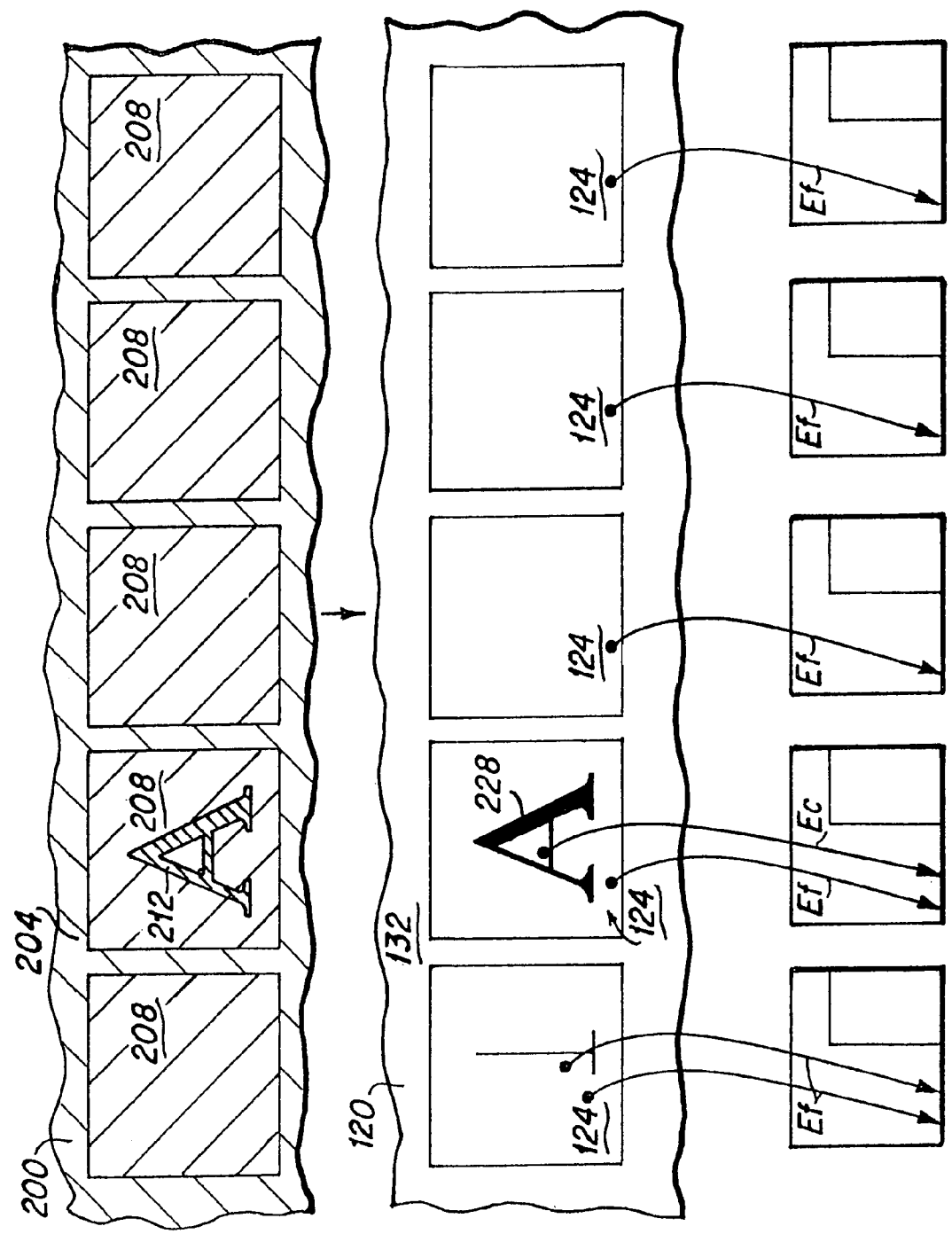
FIG. 4 is a diagrammatic depiction of a second photolithographic mask that is utilized in the photolithographic method for fabricating a series of characters of the present invention.

Thereafter a second exposure is conducted utilizing the second mask 200, as depicted in FIG. 4. Although it is not required, in an embodiment of the invention the second mask 200 may have the same light transmission characteristics as the first mask 100. Therefore, as can be seen in FIG. 4, the second mask 200 includes a background field area 204, character field areas 208 and a character (A) area 212. The character field areas 208 are not opaque; rather, the character field areas are designed to transmit some light energy density therethrough, and the character field areas 208 will have a light transmission factor $T_f$. Additionally, the character area 212 of the mask 200 will have a light transmission factor $T_c$ that is greater than $T_f$ of the character field areas 208. The background field area 204 may be opaque or it may have a light energy density transmission factor that is less than or equal to the light energy density transmission factor $T_f$ of the character field areas. Therefore, assuming a light intensity I, which for simplicity of this explanation will be assumed to be identical to the light exposure intensity of the first exposure, when the photoresist 120 is exposed using the second mask 200 for a time t (again for simplicity assumed to be the same exposure time as the first exposure), the character field areas 124 of the photoresist 120 receive a light exposure energy density of $E_f$, where $E_f=I_f\times t$ and the photoresist region 228 where the second character (A) is to be located receives an increased exposure energy density $E_c$, where $E_c=I_c\times t$. The background field area 132 of the photoresist 120 may receive zero light energy density if the background field area 204 of the mask 200 is opaque, or it may receive light energy density such as $E_f$ if the background field area of the mask has a transmission factor such as Tf. Therefore, following the exposure utilizing the second mask 200, the character field areas 124 of the photoresist 120 have now received a total exposure energy density of $2E_f$, whereas the first character area 128 and the second character area 228 of the photoresist 120 have each received a total exposure energy density of $E_c$ plus $E_f$.

Figure 5:
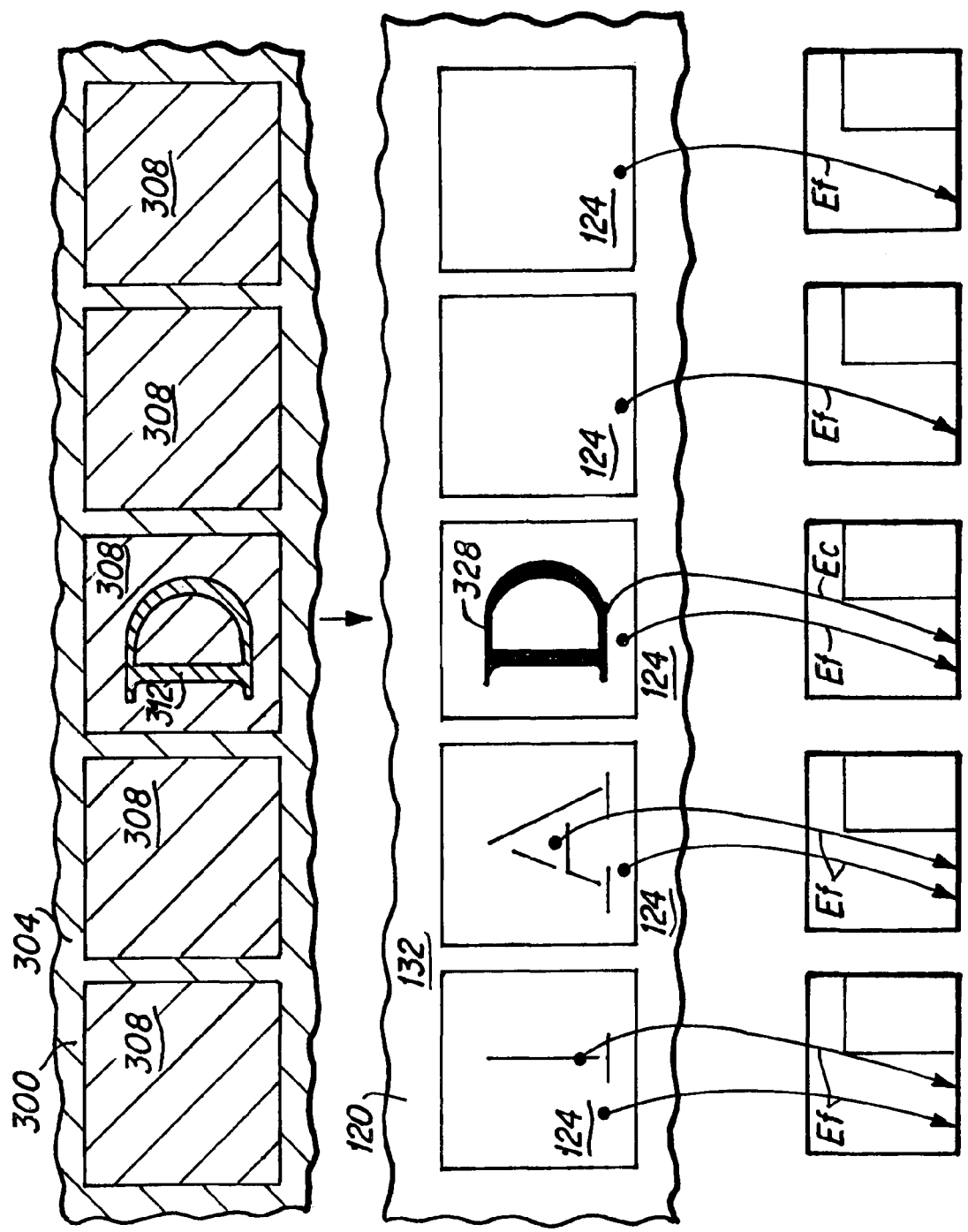
FIG. 5 is a diagrammatic depiction of a third photolithographic mask that is utilized in the photolithographic method for fabricating a series of characters of the present invention.

A third exposure is next conducted, utilizing the third mask 300, as is depicted in FIG. 5. Again, although it is not required, in an embodiment of the invention the third mask 300 may have the same light transmission characteristics as the first and/or second masks. Therefore, as can be seen in FIG. 5, the third mask 300 includes a background field area 304, character field areas 308 and a character (D) area 312. The character field areas 308 are not opaque; rather, the character field areas have a light transmission factor $T_f$. Additionally, the character area 312 of the mask 300 will have a light transmission factor $T_c$ that is greater than $T_f$ of the character field areas 308. The background area 304 may be opaque or it may have a light energy density transmission factor that is less than or equal to the light energy density transmission factor $T_f$ of the character field areas. Therefore, assuming a light intensity I which for simplicity of this explanation will be assumed to be identical to the light exposure intensity of the first and second exposures, when the photoresist 120 is exposed using the third mask 300 for a time t (again for simplicity assumed to be the same exposure time as the first and second exposures), the character field areas 124 of the photoresist 120 receive a further light exposure energy density of $E_f$, where $E_f = I_f \times t$, and the photoresist region 328 where the third (D) character is to be located receives an increased exposure energy density $E_c$, where $E_c = I_c \times t$. The background field area 132 of the photoresist may receive zero light energy density if the background field area 304 of the mask 300 is opaque, or it may receive light energy density such as $E_f$ where the background field area of the mask has a transmission factor such as $T_f$. Therefore, following the third mask exposure, the character field areas 124 of the photoresist 120 have received another exposure energy density $E_f$, such that the total exposure energy density in the character field areas 124 is $3E_f$, whereas each of the three character areas 128, 228, 328 of the photoresist 120 has received a total exposure energy density of $E_c$ plus $2E_f$.

Figure 6:
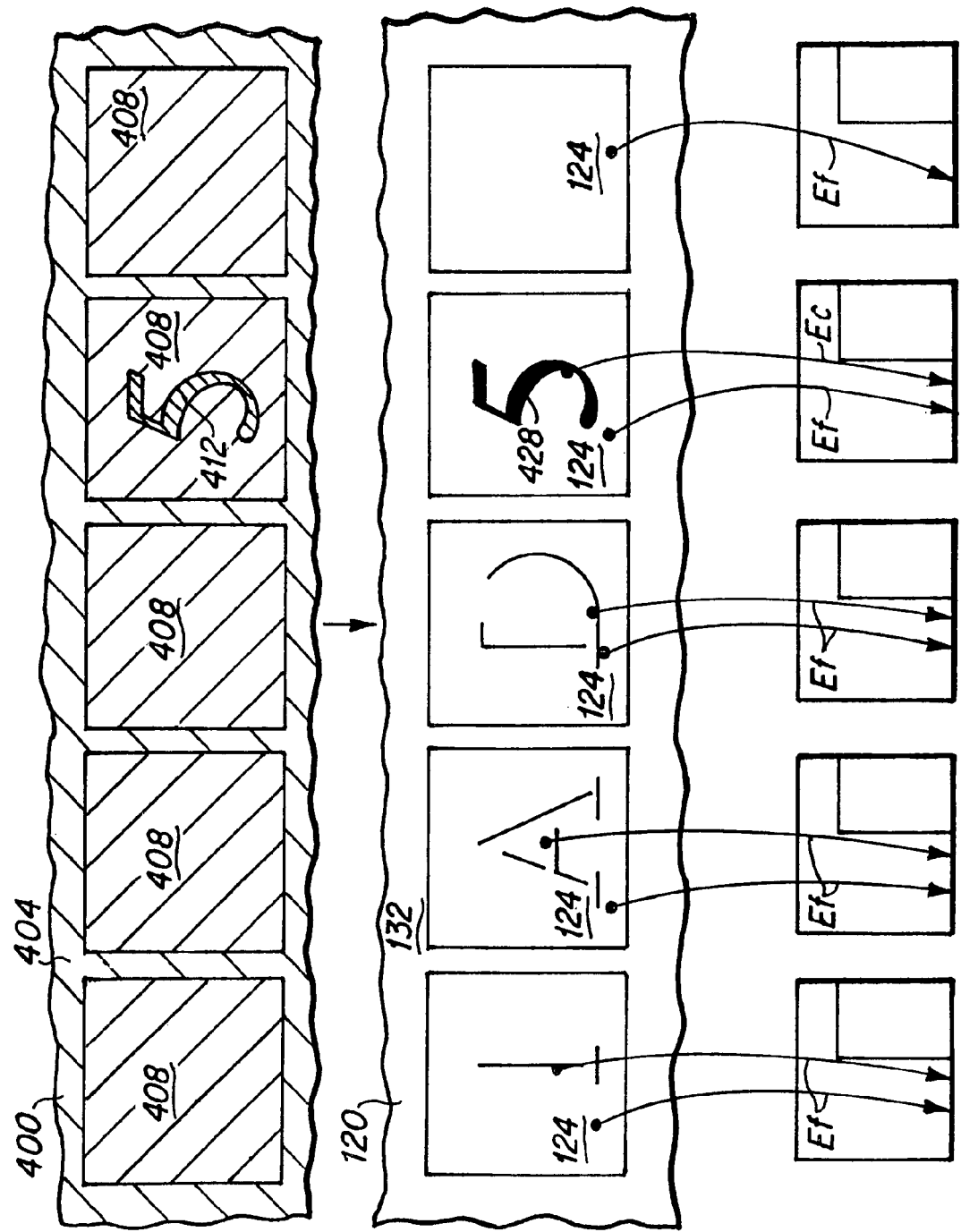
FIG. 6 is a diagrammatic depiction of a fourth photolithographic mask that is utilized in the photolithographic method for fabricating a series of characters of the present invention.

A fourth character exposure is next conducted utilizing the further mask 400 depicted in FIG. 6. Again, although it is not required, in an embodiment of the invention the fourth mask 400 may have the same light transmission characteristics as the prior masks 100, 200, 300. Therefore, as can be seen in FIG. 6, the fourth mask 400 includes a background field area 404, character field areas 408 and a character (5) area 412. The character field areas 408 are not opaque but have a light transmission factor $T_f$. Additionally, the character area 412 of the mask 400 will have a light transmission factor $T_c$ that is greater than $T_f$ of the character field areas 408. The background field area 404 may be opaque or it may have a light energy density transmission factor that is less than or equal to the light energy density transmission factor $T_f$ of the character field areas 408. Therefore, assuming a light intensity I which for simplicity of this explanation will be assumed to be identical to the light exposure intensity of the prior exposures, when the photoresist 120 is exposed using the fourth mask 400 for a time t (again for simplicity assumed to be the same exposure time as the prior exposures), the character field areas 124 of the photoresist 120 receive a further light exposure energy density of $E_f$, where $E_f = I_f \times t$, and the photoresist region 428 where the fourth character (5) is to be located receives an increased exposure energy density $E_c$, where $E_c = I_c \times t$. The background field area 132 of the photoresist may receive zero light energy density if the background field area 404 of the mask 400 is opaque, or it may receive light energy density such as $E_f$ where the background field area of the mask has a transmission factor such as $T_f$. Therefore, following the exposure utilizing the mask 400 of FIG. 6, the character field areas 124 of the photoresist 120 have now received a total exposure energy density of $4E_f$, whereas each of the character areas 128, 228, 328, 428 of the photoresist 120 has received a total exposure energy density of $E_c$ plus $3E_f$.

Figure 7:
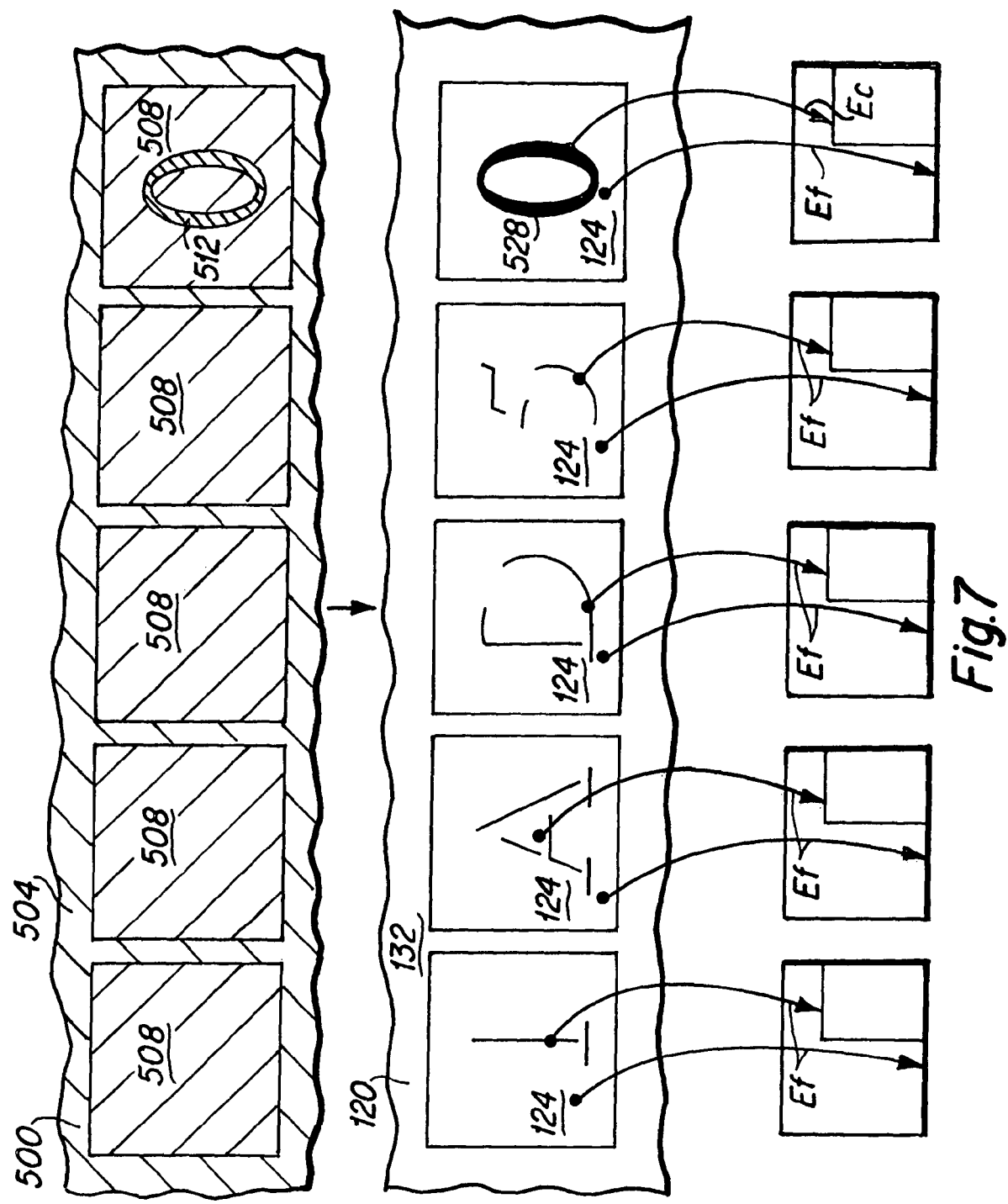
FIG. 7 is a diagrammatic depiction of a fifth photolithographic mask that is utilized in the photolithographic method for fabricating a series of characters of the present invention.

The last character exposure is next conducted utilizing the fifth mask 500 of FIG. 7. Again, although it is not required, in an embodiment of the invention the fifth mask 500 may have the same light transmission characteristics as the prior masks 100, 200, 300, 400. Therefore, as can be seen in FIG. 7, the fifth mask 500 includes a background field area 504, character field areas 508 and a character (0) area 512. The character field areas 508 are not opaque; but have a light transmission factor $T_f$. Additionally, the character areas 512 of the mask have a light transmission factor $T_c$ that is greater than $T_f$ of the character field areas 508. The background field area 504 may be opaque or it may have a light energy density transmission factor that is less than or equal to the light energy density transmission factor $T_f$ of the character field areas 508. Therefore, assuming a light intensity I which for simplicity of this explanation will be assumed to be identical to the light exposure intensity of the prior exposures, when the photoresist 120 is exposed using the fifth mask 500 for a time t (again for simplicity assumed to be the same exposure time as the prior exposures), the character field areas 124 of the photoresist 120 receive a further light exposure energy density of $E_f$, where $E_f = I_f \times t$, and the photoresist region 528 where the fifth character (0) is to be located receives an increased exposure energy density $E_c$, where $E_c = I_c \times t$. The background field area 132 of the photoresist 120 may receive zero light energy density if the background field area 504 of the mask 500 is opaque, or it may receive light energy density such as $E_f$ where the background field area of the mask has a transmission factor such as $T_f$. Following the exposure of the last character utilizing the mask of FIG. 7, it is seen that the character field areas 124 of the photoresist 120 have now received a total exposure energy density of $5E_f$, whereas the character areas 128, 228, 328, 428, 528 of the photoresist 120 have each received a greater exposure energy density of $E_c$ plus $4E_f$.

With reference to FIG. 1 it is now to be understood that the exposure times and intensities and therefore the total exposure energy density ($5E_f$) of the photoresist 120 in the character field areas 124 is less than the exposure energy density $E_t$, whereas the total exposure energy density of each character area 128, 228, 328, 428, 528 of the photoresist ($E_c$ plus $4E_f$) is greater than $E_o$, and is sufficient to fully expose each character. The background field areas 132 of the photoresist have a total exposure energy density that is less than or equal to the character field area total exposure energy density.

As can be understood from FIG. 1 and the preceding description, it isn't required that each mask have the same character field area transmission factor $T_f$ or the same character area transmission factor $T_c$, or that the same exposure intensity I or exposure time t be utilized in the sequential mask exposure process; rather what is required is that the total photoresist character field area exposure energy density be less than $E_t$ and that the total character area exposure energy density of the photoresist be greater than $E_o$.

As will be next described, a significant feature of the present invention is that the exposure time that is conducted utilizing each mask, and therefore the total exposure time when all of the masks are utilized, is significantly less than the total exposure time of the prior art. This reduced total exposure time occurs because each of the character areas of the photoresist is partially exposed with an exposure energy density $E_f$ when utilizing each mask other than the character mask for that character. As a result, the exposure time for each character is significantly reduced owing to the additional exposure energy density that the character areas of the photoresist receive from each successive mask. A generalized analysis of the sequential mask exposure method of the present invention can now be presented.

For a generalized method of the present invention utilizing N identical masks having the characteristics of the masks depicted in FIGS. 3-7 and described above, the total character area exposure energy density $E_{tc}$ is, $$E_{tc} = (N-1)I_f(t) + I_c(t) = I_c(t_p) \quad (1)$$

where $I_f$ is the character field area intensity, $I_c$ is the character area intensity, t is the mask exposure time and $t_p$ is the prior art mask exposure time, and where the character area intensity $I_c$ of the prior art is the same as the character area intensity $I_c$ of the present method; which assumes that the character transmission factor $T_c$ in this generalized description of the present method is the same as the prior art, that is unity, because the character area of the prior art mask is clear.

Now, a useful ratio R can be created where $$R = T_f/T_c \quad (2)$$

which is the ratio of the mask transmission factors of the mask of the present invention. And this ratio R can also be expressed as $$R = T_f/T_c = I_f/I_c = I_f(t)/I_c(t) = E_f/E_c \quad (3)$$

which is the ratio of exposure energy densities that illuminate the character field area and character area of the photoresist.

Another useful ratio r can also be created where $$r = t_p/t \quad (4)$$

which is the ratio of prior art mask exposure time to the present invention mask exposure time t.

Now dividing equation 1 by $I_c$ and substituting R creates the relationship $$[(N-1)R+1](t) = t_p \quad (5)$$

and dividing equation 5 by t and substituting r yields $$(N-1)R+1 = r \quad (6)$$

Now regarding the total exposure energy densities it can be said that $$E_{tf} < E_{tc} \quad (7)$$

where $E_{tf}$ is the total character field area exposure energy density and $E_{tc}$ is the total character exposure energy density, and this can be further expressed as $$E_{tf} + \Delta E = E_{tc} \quad (8)$$

and the total character field exposure energy density $E_{tf}$ can be expressed as $$E_{tf} = NI_f(t) \quad (9)$$

Now substituting equations 9 and 1 into equation 8 yields $$NI_f(t) + \Delta E = (N-1)I_f(t) + I_c(t) = I_c(t_p) \quad (10)$$

and therefore $$I_f(t) + \Delta E = I_c(t) \quad (11)$$

and dividing by $I_c(t)$ and substituting R creates the relationship $$R + \Delta E/I_c(t) = 1 \quad (12)$$

and a safety factor S is now created where $$S = \Delta E/I_c(t) \quad (13)$$

Therefore the following relationships can be created; from equations 12 and 13

$$R + S = 1 \quad (14)$$

and from equations 10 and 13

$$NR + S = r \quad (15)$$

and $$S = r - NR \quad (16)$$

and from equations 10 and 3

$$r = (N-1)R + 1 \quad (17)$$

The significance of the mask transmission factor ratio R, and the mask exposure time ratio r, and the safety factor S can be understood from the following Table I.

TABLE I

| N − 1 | R | r | S | 1/S | 1/R |
|---|---|---|---|---|---|
| 4 | 1/20 | 1.2 | 0.950 | 1.053 | 20 |
| " | 1/8 | 1.5 | 0.875 | 1.148 | 8 |
| " | 1/4 | 2 | 0.750 | 1.333 | 4 |
| " | 1/2 | 3 | 0.500 | 2 | 2 |
| " | 3/4 | 4 | 0.250 | 4 | 1.34 |
| " | 7/8 | 4.5 | 0.125 | 8 | 1.14 |
| " | 15/16 | 4.75 | 0.0625 | 16 | 1.06 |
| " | 1 | 5 | 0 | ∞ | 1 |
| " | 0 | 1 | 1 | 1 | ∞ |

Table I indicates that for a five mask system (N=5), where the ratio of mask transmission factors R is 1/20, that a time savings ratio r per mask of 1.2 is achieved with a safety factor S of 0.950. This shows a modest time savings (r=1.2) over the prior art where the character field transmission factor $T_f$ of the masks is significantly greater (20 times greater (R=1/20)) than the character transmission factor $T_c$.

Now examining the case where R=3/4 (the mask transmission factors are much closer), it can be seen that a time exposure ratio r=4 is created; that is, that the present invention requires only 1/4 of the exposure time of the prior art. This represents a significant process time savings of the present invention as compared to the prior art. Particularly, where a prior art mask exposure time of two minutes is required to expose a character area, for a five character identifier the total prior art process time is ten minutes. In comparison thereto, the present invention mask exposure time is 30 seconds (1/4 of the prior art (r=4)), and the total five mask exposure time is only 2.5 minutes.

It can therefore be seen that the present invention can achieve significant process time savings through the partial exposure of the character areas of the photoresist during each of the N−1 mask exposures using masks other than the particular character mask.

It is therefore to be understood that the present invention uses non-zero transmittance masks as part of a multi-exposure photolithographic process to subcritically expose photoresist in regions that are usually unexposed in the conventional process as known in the photolithographic art. The invention is distinguished from the prior art conventional photolithographic processes in that unlike such conventional processes, masks having opaque portions of zero transmittance are not used to form blank unexposed regions where the latent images of additional features are subsequently formed. Rather, in the method of the present invention, masks having non-opaque portions of partial transmittance are used to form blank partially exposed regions in the photoresist where the latent images of additional features are subsequently formed.

Therefore, it is not necessary to completely cut off light from portions of the photoresist that will subsequently be exposed to form latent images of structures, and in particular, sequentially printed members of a character string as required by a wafer serialization process. Instead, multiple exposures can be performed in the photoresist that are subcritical with regard to the formation of a latent image in the blank regions of the photoresist reserved for the printing of successive latent images of additional features in one embodiment, or alternatively with regard to the formation of multiple latent images in another embodiment, in the same region of photoresist that can later be developed to bring out one or more of these latent images. A preferred embodiment of the present invention is for the printing of sequential members of character strings used to identify slider row and column positions on a wafer, and used to label sliders with the wafer number from which the sliders originated. Moreover, the invention may have many fundamental and novel applications outside of the particular embodiments recited with regard to wafer serialization when the invention is applied to the art of photolithography more generally.

An embodiment of the invention may be described as a method of photolithographic processing including: 1) a first exposing of a photoresist layer with a radiation transmitted through a first mask having first regions of partial transmittance; 2) a second exposing of the photoresist layer with a radiation transmitted through a second mask having features defined over the regions of photoresist exposed to the partially transmitted light of the first exposing, wherein a latent image of the features is formed in the regions of photoresist exposed to the partially transmitted light of the first exposing; and 3) developing the photoresist to selectively develop a latent image of features formed in the regions of photoresist exposed to the partially transmitted light.

An alternative embodiment of the invention may be described as a method of photolithographic processing of the first embodiment wherein the first mask has opaque regions, regions of partial transmittance, and regions of essentially full transmittance, wherein the opaque regions correspond to unexposed regions of the photoresist, the partial transmittance regions, to partially exposed regions of photoresist, and the essentially full transmittance regions to essentially fully exposed regions of photoresist.

Another embodiment of the invention may be described as a method of photolithographic processing of the second method wherein the second mask has opaque regions, regions of partial transmittance, and regions of essentially full transmittance, wherein the opaque regions correspond to unexposed regions of the photoresist, the partial transmittance regions, to partially exposed regions of photoresist, and the essentially full transmittance regions to essentially fully exposed regions of photoresist.

Another embodiment of the invention may be described as a method of photolithographic processing of the first method wherein 1) the first mask has opaque regions, regions of partial transmittance, and regions of essentially full transmittance, wherein the opaque regions correspond to unexposed regions of the photoresist or opaque patterns that serve to define a first character of a character string, the partial transmittance regions to partially exposed regions of photoresist, and the essentially full transmittance regions to essentially fully exposed regions of photoresist; and 2) wherein the second mask has opaque regions, regions of partial transmittance, and regions of essentially full transmittance, wherein the opaque regions correspond to unexposed regions of the photoresist or opaque patterns that serve to define a subsequent character of a character string, the partial transmittance regions, to partially exposed regions of photoresist, and the essentially full transmittance regions to essentially fully exposed regions of photoresist.

Another embodiment of the invention may be described as a method of photolithographic processing of the methods described above wherein the regions of partial transmittance of the first mask are selected from the group consisting of a partially transmitting metallic layer, a pattern of light transmitting pinholes in an opaque field, a pattern of opaque features in a essentially light transmitting field, or a partially transmitting glass layer, wherein said regions of partial transmittance produce a subcritically exposed region of photoresist in which a subsequent latent image of a feature is formed. A partially transmitting metallic layer can be fabricated from a thin film of metal sufficiently thin to allow light to pass through it. A suitably thin layer of metal can be deposited by evaporation or sputtering under conditions favoring the coalescence of the metallic film into a continuous layer as is known in the art. A pattern of light transmitting pinholes can be fabricated by depositing a thin metallic film so thin that the film fails to coalesce into a continuous layer. The film consists essentially of metallic grains that are interconnected in a percolating pattern punctuated by intermittently dispersed pinholes. Again, such a film can be fabricated by the usual thin film deposition techniques of evaporation or sputtering but under conditions known in the art to prevent coalescence into a continuous layer. Alternatively, with even lower amounts of deposited material, the metallic grains may fail to link up into a percolating pattern; but rather, areas devoid of the light blocking material form a percolating pattern punctuated by intermittently dispersed metallic grains, or metallic islands, as is known in the art. Finally, the partially transmitting regions of a glass sheet may be produced in a photochromic glass that changes its transmissivity as a function of exposure to light transmitted through a conventional mask, or by electron lithography through the interaction of electrons with photochromic centers dispersed throughout the glass. When photons or electrons of a given energy interact with these photochromic centers, such incident radiation can change the transmissivity of the glass where such centers are located as is known in the art. Alternatively, any combination of the above methods of creating a partially transmitting region may be used to create a partially transmitting region of a mask.

Another embodiment of the invention may be described as a method of photolithographic processing as described above wherein the regions of partial transmittance of the second mask are selected from the group consisting of a partially transmitting metallic layer, a pattern of light transmitting pinholes in an opaque field, a pattern of opaque features in a essentially light transmitting field, or a partially transmitting glass layer, wherein said regions of partial transmittance produce a subcritically exposed region of photoresist in which a subsequent latent image of a feature is formed.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What is claimed is:

1. A photolithographic method for forming a plurality of characters on a device, comprising: fabricating a photoresist layer upon the device in a location for forming the characters; exposing said photoresist to radiation energy density through a set of masks, where each mask has at least one mask character area and at least one mask character field area; wherein the photoresist is exposed to radiation energy density through a mask character field area during each mask exposure, and wherein the photoresist is also exposed to radiation through a mask character area during each mask exposure.

2. A photolithographic method as described in claim 1 wherein the radiation energy density that passes through the mask character field area is less than the radiation energy density that passes through the mask character area, wherein a periphery of each of the mask character areas is defined by shaped edges of one of the mask character field areas thereby defining a periphery of the character created by the mask character area.

3. A photolithographic method as described in claim 1 wherein a mask character field area surrounds each character area; wherein each said mask character field area has an energy density transmission factor $T_f$ that is greater than zero, and wherein each mask character area has an energy density transmission factor $T_c$ that is greater than zero, such that each mask character field area and each mask character area of each mask is not opaque.

4. A photolithographic method as described in claim 3 wherein $T_c$ is greater than $T_f$, such that more radiation energy density passes through the mask character area of the mask than through the mask character field area of the mask.

5. A photolithographic method as described in claim 1 wherein each mask has one mask character area and a plurality of mask character field areas, wherein the masks are used sequentially in sequential exposures to form the characters, wherein the mask character field areas are aligned over the same areas of the device in the subsequent exposures.

6. A photolithographic method as described in claim 5 wherein said mask character area of each mask is disposed within a mask character field area of that mask.

7. A photolithographic method as described in claim 1 wherein said set of masks includes N masks and each mask includes one mask character area and N-1 mask character field areas.

8. A photolithographic method as described in claim 7 wherein said N masks may be arranged in registration, such that a mask character area of each mask corresponds with a mask character field area of the remaining N-1 masks.

9. A photolithographic method as described in claim 1 wherein one or more of said masks comprises a continuous thin metallic film that is formed upon a substrate.

10. A photolithographic method set as described in claim 1 wherein one or more of said masks comprises a plurality of light transmitting pin holes formed in a thin metallic film upon a substrate.

11. A photolithographic method as described in claim 1 wherein one or more of said masks comprises a plurality of light blocking metallic islands formed on a substrate.

12. A photolithographic method as described in claim 1 wherein one or more of said masks comprises a photochromatic glass that changes its transmisivity as a function of exposure to light.

13. A photolithographic method for fabricating a plurality of characters on a device, comprising: fabricating a layer of photoresist material in an area of the device in which the characters are to be formed, said photoresist having a radiation energy density value $E_t$ wherein radiation energy density exposure below $E_t$ will not affect the photoresist during development, and a radiation energy density value $E_o$ wherein radiation energy density exposure above $E_o$ will affect the photoresist during development; identifying at least one character field area of said photoresist, wherein each character field area includes at least one character area of the photoresist in which a separate identification character will be formed; exposing each said character field area of the photoresist to radiation energy density, such that the total radiation energy density exposure in the character field area is less than $E_t$; exposing each said character area of the photoresist to additional radiation energy density, such that the total character area radiation energy density exposure in the character area is greater than $E_o$, wherein a first mask character field area of each of a plurality of masks at a first position on each mask have about a same physical area, wherein a second mask character field area of each of the masks at a second position on each mask have about a same physical area, wherein the first and second positions are the same for each of the masks, wherein the mask character field areas of each mask are positioned over same areas of the photoresist during each of the exposures such that each exposure increases a total exposure time of the photoresist areas.

14. A photolithographic method as described in claim 13 wherein each character area of said photoresist is exposed to radiation energy density from multiple exposures using differing masks of a set of masks, wherein a periphery of each of the mask character areas is defined by shaped edges of one of the mask character field areas thereby defining a periphery of the character created by the mask character area.

15. A photolithographic method as described in claim 13 wherein each character area of said photoresist is disposed within a character field area of the photoresist.

16. A photolithographic method as described in claim 14 wherein each said mask includes at least one mask character field area and at least one mask character area, and wherein each character area of said photoresist is exposed to radiation energy density from a plurality of mask character field areas plus radiation energy density from one mask character area.

17. A photolithographic method as described in claim 13 wherein a plurality of masks are utilized to create the identification characters, wherein each mask includes at least one mask character field area having a radiation energy density transmission factor $T_f$, and at least one mask character area having a radiation transmission factor $T_c$, wherein $T_f$ and $T_c$ are both greater than zero.

18. A photolithographic method as described in claim 17 wherein N masks are utilized to create N characters.

19. A photolithographic method as described in claim 14 wherein one or more of said masks comprises a continuous thin metallic film that is formed upon a substrate.

20. A photolithographic method as described in claim 14 wherein one or more of said masks comprises a plurality of light transmitting pin holes formed in a thin metallic film upon a substrate.

21. A photolithographic method as described in claim 14 wherein one or more of said masks comprises a plurality of light blocking metallic islands formed on a substrate.

22. A photolithographic method as described in claim 14 wherein one or more of said masks comprises a photochromatic glass that changes its transmisivity as a function of exposure to light.

23. A photolithographic method as described in claim 1, wherein the radiation energy density that passes through the mask character area of the associated mask during the respective exposure is insufficient to impart on the photoresist a total character area exposure energy density of greater than $E_o$.

24. A photolithographic method as described in claim 3, wherein a background area surrounds each character field area, wherein the background area is opaque or has a light energy density transmission factor that is less than $T_f$.

25. A photolithographic method as described in claim 1, wherein an exposure time during each individual exposure is insufficient to impart on the photoresist a total character area exposure energy density of greater than $E_o$ during the individual exposure.

26. A photolithographic method as described in claim 2, wherein the mask character field areas of each mask are positioned over same areas of the photoresist during each of the exposures such that each exposure increases a total exposure time of the photoresist areas.

27. A photolithographic method as described in claim 14, wherein the radiation energy density that passes through the mask character area of the associated mask during the respective exposure is insufficient to impart on the photoresist a total character area exposure energy density of greater than $E_o$.

28. A photolithographic method as described in claim 14, wherein a background area surrounds each character field area, wherein the background area is opaque or has a light energy density transmission factor that is less than $T_f$.

29. A photolithographic method as described in claim 14, wherein an exposure time during each individual exposure is insufficient to impart on the photoresist a total character area exposure energy density of greater than $E_o$ during the individual exposure.

\* \* \* \* \*